United States Patent

McHugh

Patent Number: 5,286,207
Date of Patent: Feb. 15, 1994

[54] MEMORY CARD CONNECTOR

[75] Inventor: Robert G. McHugh, Evergreen, Calif.

[73] Assignee: Foxconn International, Inc., Sunnyvale, Calif.

[21] Appl. No.: 994,617

[22] Filed: Dec. 21, 1992

[51] Int. Cl.⁵ .................................................. H01R 9/09
[52] U.S. Cl. .................................... 439/64; 439/79; 439/159
[58] Field of Search ............... 439/64, 79, 80, 108, 439/152–160, 181, 377, 540, 607, 609

[56] References Cited

U.S. PATENT DOCUMENTS

| | | | |
|---|---|---|---|
| 4,080,041 | 3/1978 | Hawkins, Jr. | 439/79 |
| 4,718,867 | 1/1988 | Seidel et al. | 439/609 |
| 4,810,200 | 3/1989 | Sakamoto | 439/155 |
| 4,818,239 | 4/1989 | Erk | 439/540 |
| 4,993,803 | 2/1991 | Suverision et al. | 439/76 |
| 5,037,330 | 8/1991 | Fulponi et al. | 439/607 |
| 5,044,984 | 9/1991 | Mosser et al. | 439/540 |
| 5,080,609 | 1/1992 | Fabian et al. | 439/540 |
| 5,085,590 | 2/1992 | Galloway | 439/95 |
| 5,123,851 | 6/1992 | Young et al. | 439/67 |
| 5,149,276 | 9/1992 | Dixon | 439/159 |
| 5,167,531 | 12/1992 | Broschard et al. | 439/540 |
| 5,176,523 | 1/1993 | Lai | 439/64 |

Primary Examiner—Neil Abrams

[57] ABSTRACT

A memory card connector assembly has an upper and a lower stacked connectors (10) each including a generally H-shaped housing (12) comprising a main body (14) through which a plurality of contacts (120, 126, 134) extend in the front-to-back direction. Two parallel side guide arms (16, 18) are positioned at two ends of the main body (14) to form a first recess (30) for receiving an alignment comb (140) in the upper connector and an auxiliary socket (150) in the lower connector, and a second recess (38) for receiving a memory card therein. The contacts (134) of the upper connector (10) extend through the alignment comb (140) for horizontal alignment and through the auxiliary socket (150) for vertical alignment. Each connector 10 further comprises a sliding plate (72) operated by a lever (62) for extraction of the inserted memory card. Attached to the housing (12) is a reinforcement plate (100) with tangs (110) for removing electrostatic charge from the inserted card.

20 Claims, 18 Drawing Sheets

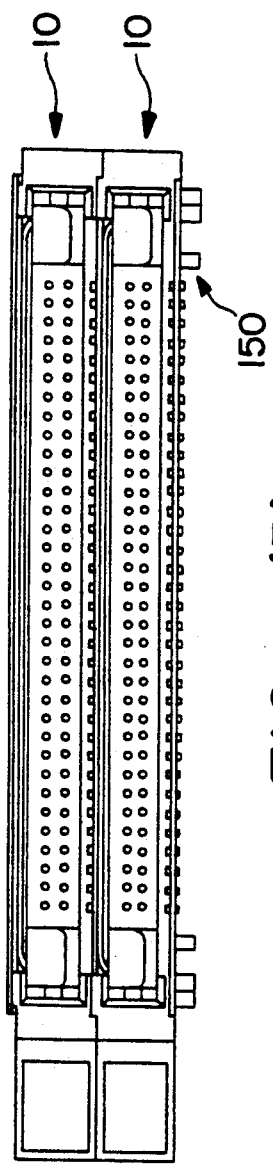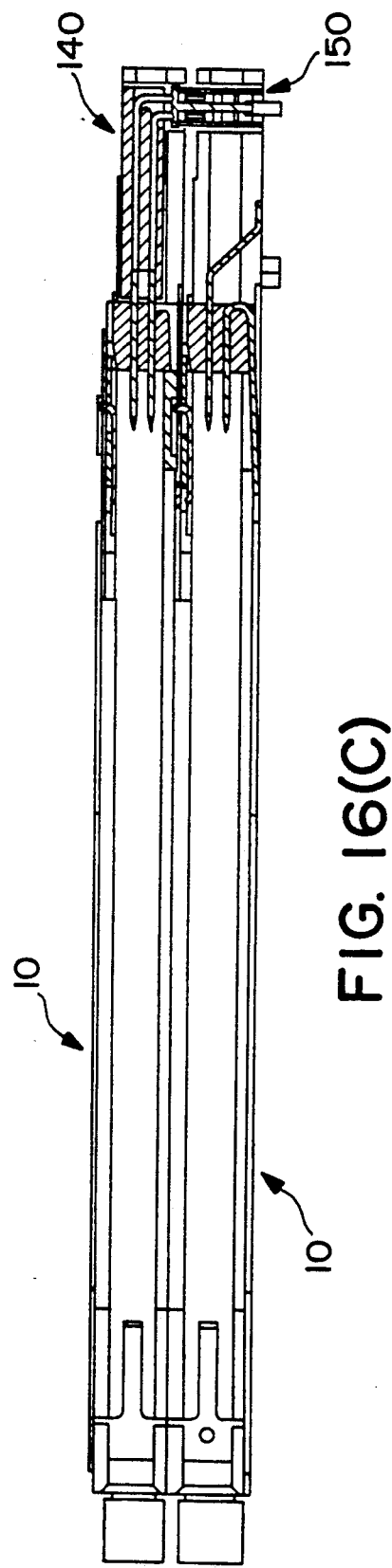
FIG. 16(B)
FIG. 16(C)

MEMORY CARD CONNECTOR

BACKGROUND OF THE INVENTION

1. Field of the Invention

The present invention relates to memory card connector assemblies, and particularly to a dual IC package connector assembly which has a pair of similar connectors stacked together for reception of two IC memory cards, respectively.

2. Description of the Prior Art

IC packs or memory cards are used in a variety of electronic equipment, especially in laptop, palmtop, even notebook computers. The reason is that memory cards have recently been developed to improve memory capabilities in computer system and their modularity, increased memory capacity and smaller physical dimensions make them particularly desirable, especially in small-sized computer. Some prior art devices can be referred to U.S. Pat. Nos. 5,176,523, 5,161,989, 5,152,697, 5,051,101, 5,149,276, 5,145,389, 5,139,435, 5,011,420, 4,952,161 and 4,810,200.

As disclosed in aforementioned U.S. Pat. No. 5,149,276 to Dixon, it is desired to have a array of cards for saving space, so that a plurality of the devices may be stacked one upon the other with sufficient spacing allowed for operation. Also, in aforementioned U.S. Pat. No. 5,176,523 to Lai, which has the same assignee as the present invention, teaches mechanism able to reduce the whole height when a plurality of memory card connectors are aligned and stacked together.

Even though the stacked type connector assemblies are more space efficient, another problem may occur about the alignment of the upper connector contacts with the corresponding conductive circuit traces positioned on the main board on which the connector assembly is seated because there is a significant vertical distance between the horizontal position of the upper connector contact and the main board. It can be seen that the vertical tail portions of such upper connector contacts may easily obliquely extend downwardly due to shortness of support means in the vertical direction. This situation becomes serious when the tails of the upper connector contacts are required to extend a distance in the horizontal direction for corresponding to the printed circuit layout of the main board on which the connector assembly is seated. This disadvantage may also get worse when this connector assembly is used in surface mount soldering instead of through-hole soldering because through-hole mounting of the contact with the board allows a relative larger range of manufacturing tolerance than surface mount type based on self-adjustment of the former. In other words, unlike the through-hole contact, a misaligned surface mount type contact can not be correctly and exactly mounted to the corresponding circuit trace, thus affecting the soldering between the contact and the trace, and perhaps resulting in missing signals during transmission.

To solve this problem, an attempt has been made by using a flat cable connectively incorporating two Insulative Displacement Contact (IDC) connectors respectively positioned on the main board and the rear of the upper connector for connection of the upper connector contacts, which are of a short tail type, and the main board, instead of the prolong tails of the upper connector contacts extending between the main board and the upper connector. Although this type solution can prevent misalignment problem between the upper connector contacts and the board traces, those three additional components need more manual operative assembling and the flat cable intends to take more space and swing up and down. This configuration obstructs miniaturization and automation in product development, and makes the manufacturing process more complex.

Accordingly, it is desired to have a device which includes relatively compact and secure components but still achieves the same function, i.e., the alignment of the upper connector contacts with the main board on which the connector assembly is seated.

An object of the present invention is to provide means which are easily and matably connected to either the upper connector or the lower connector, and are adapted to efficiently align the tails of the upper connector contacts with the traces printed on the board on which the connector assembly is seated.

Another object of the present invention is to provide a low profile IC memory card connector regardless of single or stacked dual type. The reason why the whole thickness can be reduced is partially due to the structure that the ejection mechanism is disposed above and proximate the housing body instead of below the inserted card as shown in most prior art memory card connectors.

Yet an object of the present invention is to provide a connector assembly which allows three different type existing cards selectively to be used therewith. Moreover, each single connector can be individually utilized to be mounted on the main board with another upper connector on its top. All connectors can be made by one mold and have the same structure for mass production and lowering the cost.

Further, an object of the present invention is to provide a connector assembly, regardless of single connector or two stacked connectors, with a grounding path for ESD protection.

SUMMARY OF THE INVENTION

In view of the foregoing, the present invention is proposed with the object of providing an electrical IC memory card connector assembly having contact alignment means. The subject connector comprises a generally H-shaped insulative housing including a main body and a pair of parallel side guide arms positioned at two opposite ends thereof wherein a plurality of contacts respectively extend through the main body in the front-to-back direction. A recess is formed among the front portions of two opposite side guide arms and the main body for selectively reception of an alignment comb therein wherein each contact of the connector can extend through the alignment comb when the alignment comb is matably positioned within the recess of the connector, so that the horizontal portions of the tails of the contacts can be supported horizontally in the alignment comb for correct positions in the lengthwise direction. Alternately, parallel to the main body, an auxiliary socket can be selectively and vertically attached to proximate the front ends of the side guide arms for vertical alignment of the vertical portions of the contact tails of another connector which is stacked thereon.

When two connectors are stackably combined together, the upper connector contacts, which extend rearwardly through the attached alignment comb and are aligned therein, extend downwardly in the vertical direction and mate with the corresponding contacts positioned within the auxiliary socket which is attached to the lower connector. Because the contacts of the auxiliary socket can be directly and solderably connected to the main board on which the lower connector associated with the auxiliary socket is mounted, the upper connector contacts can be efficiently and conductively connected to the corresponding traces on the main board through the auxiliary socket.

Each connector further includes ejection mechanism comprising an ejection bar incorporating a sliding plate to operate the withdrawal of the inserted card wherein the most ejection mechanism is positioned on the top portion of the connector and close to the main body of the housing, thus enabling to optionally use critical space thereof and obtaining a low profile configuration of the connector.

Moreover, each connector optionally comprises an auxiliary reinforcement plate which can be attached to the connector either on the top or on the bottom for configurably accommodating different thickness type cards therein. The auxiliary reinforcement plate also functions as a conductive path for ESD (Electrostatic Discharge) protection.

BRIEF DESCRIPTION OF THE DRAWINGS

FIG. 16(B) is a front view of the final assembled connector assembly of FIG. 16(A).

FIG. 16(C) is a side cross-sectional view of the final assembled connector assembly of FIG. 16(A) taken along line 6—6.

DETAILED DESCRIPTION OF THE PREFERRED EMBODIMENT

Reference will now be made in detail to the preferred embodiments of the invention. While the present invention has been described with reference to a few specific embodiments, the description is illustrative of the invention and is not to be construed as limiting the invention. Various modifications to the present invention can be made to the preferred embodiments by those skilled in the art without departing rom the true spirit and scope of the invention as defined by the appended claims.

Figure 1:
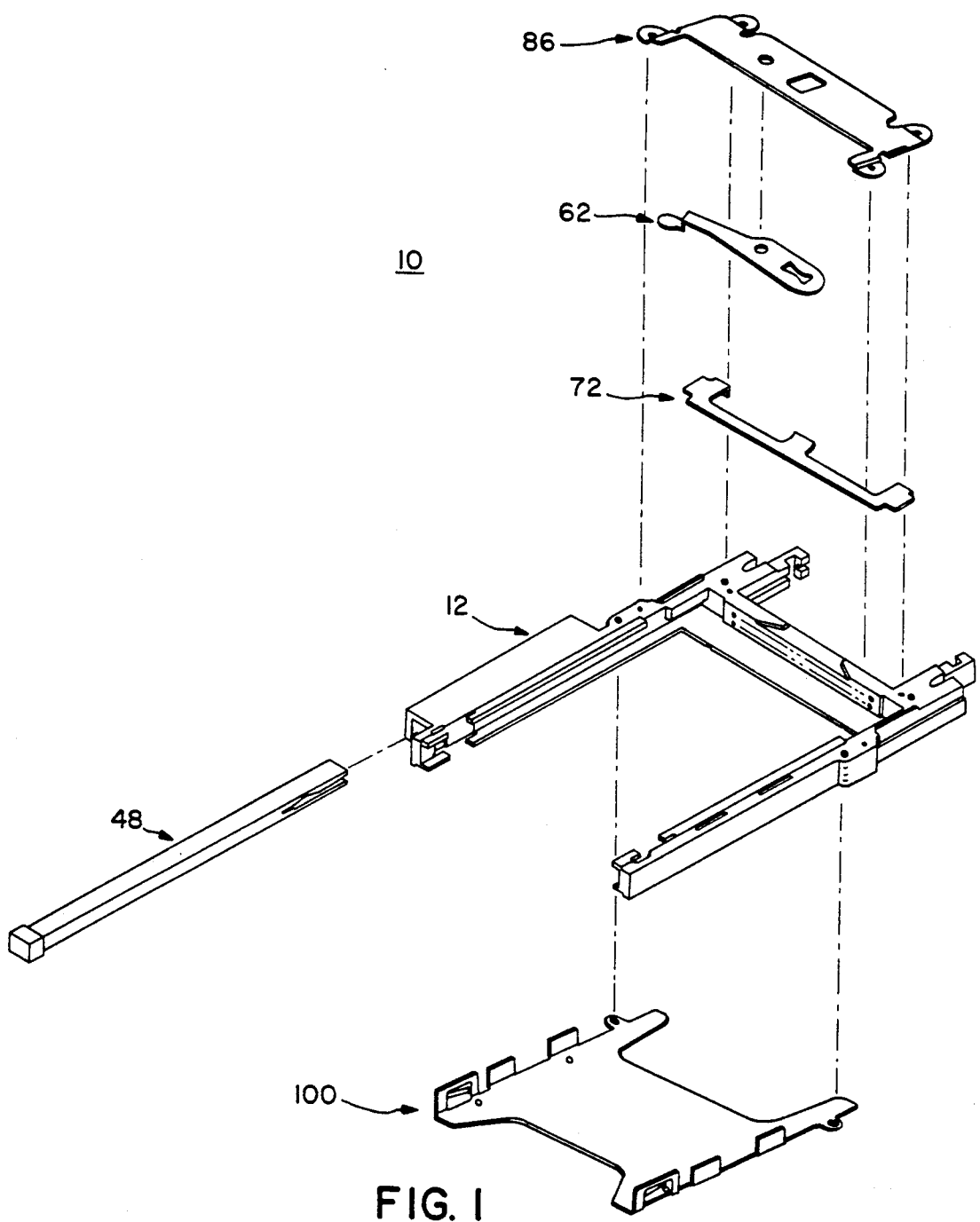
FIG. 1 is a top perspective exploded view of a presently-preferred embodiment of a stackable memory card connector without contacts therein in accordance with the present invention.
Figure 4:
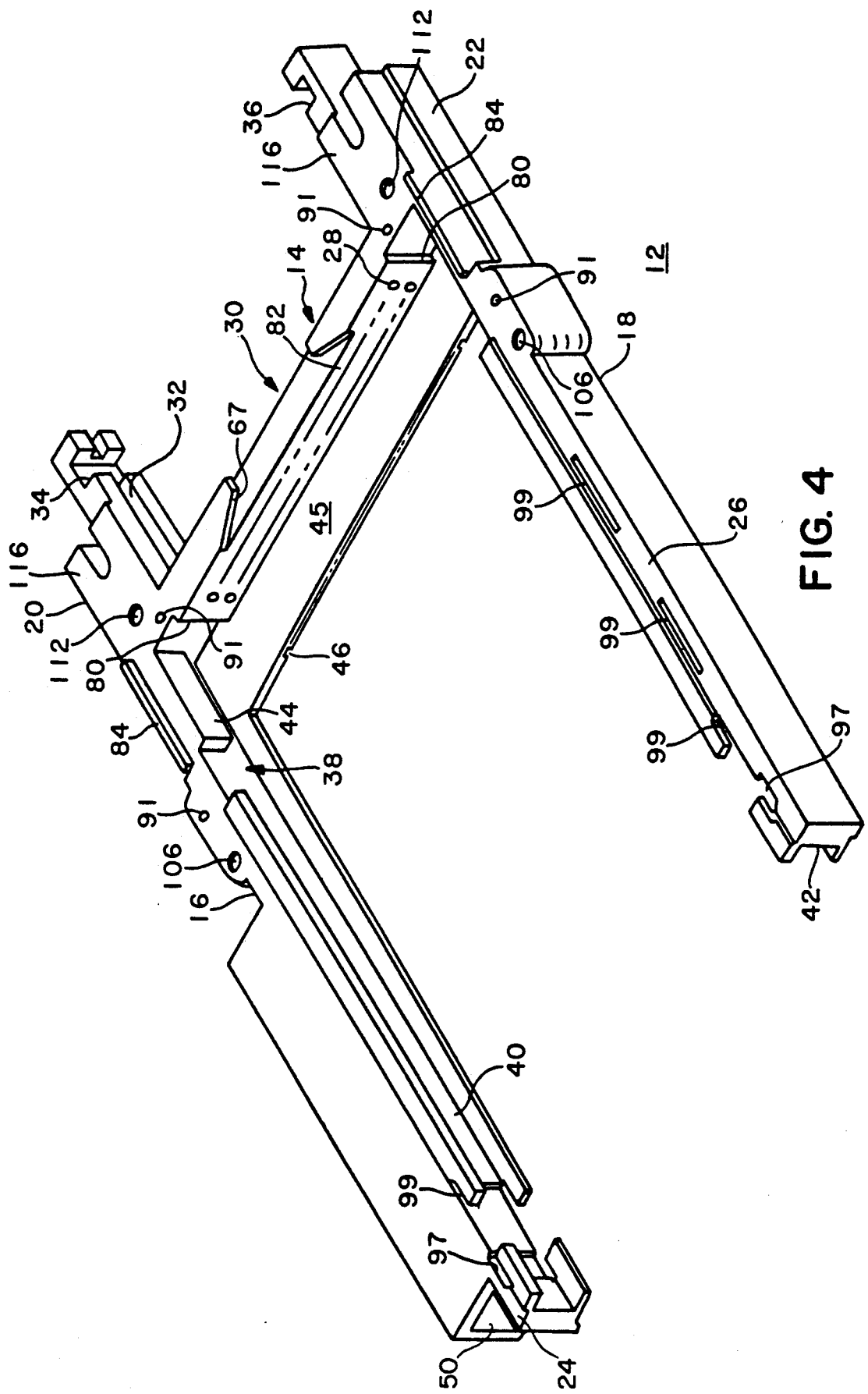
FIG. 4 is a top perspective view of the connector housing of FIG. 1.

It will be noted here that for a better understanding, like components are designated by like reference numerals throughout the various figures. Attention is now directed to FIGS. 1 and 4, where the subject stackable memory card connector, generally designated 10, has a generally H-shaped insulative housing 12 including a main body 14, a pair of, i.e., left and right, parallel side guide arms 16 and 18 positioned at two opposite ends of and normal to the main body 14, wherein each side guide arm 16, 18 includes a front portion 20, 22 and a rear portion 24, 26 which are defined by the intersection portion with the main body 14 thereof. FIG. 1 shows almost all the components and their structural relationship of the subject connector and the following FIGS. 2-13 respectively illustrate the individual component in detail for the consideration of better vision.

Two rows of plural passageways 28 which are positioned along the transverse direction of the main body 14 and extend therethrough in the front-to-back direction for receiving a plurality of contact (not shown) therein.

A first recess 30 is formed among two front portions 20, 22 of the side guide arms 16, 18 and the main body 14 wherein each front portion 20, 22 is provided with a horizontal groove 32 (only one shown) extending along its entire inner surface to the outside for engagement with a horizontally inserted alignment comb 140 which will be described in detail later.

Proximate the end of the front portion 20, 22 of each side guide arm 16, 18, a vertical groove 34, 36 extends along the inner surface for reception of a vertically inserted auxiliary socket 150 therein which will be illustrated later in detail.

Another second recess 38 is formed among two rear portions 24, 26 of the side guide arms 16, 18 and the main body 14 wherein each rear portion 24, 26 is provided with a horizontal trail 40, 42 for slidable retention with the side portion of an IC memory card (not shown) inserted within the second recess 38. A pair of polarization keys 44 (only one shown) are positioned at two opposite corners of the intersection portions of the rear portions 24, 26 of the side guide arms 16, 18 and the main body 14 for preventing any up-side-down insertion of the card.

A supporting plate 45 integrally extends rearwardly a distance from the bottom portion of the main body for support of the card. The bottom surface of the auxiliary plate 45 has a plurality of channels 46 in alignment with and in communication with the lower row passageways, respectively, for receiving the corresponding lower row contacts therein. This will be illustrated in detail later.

Figure 5A:
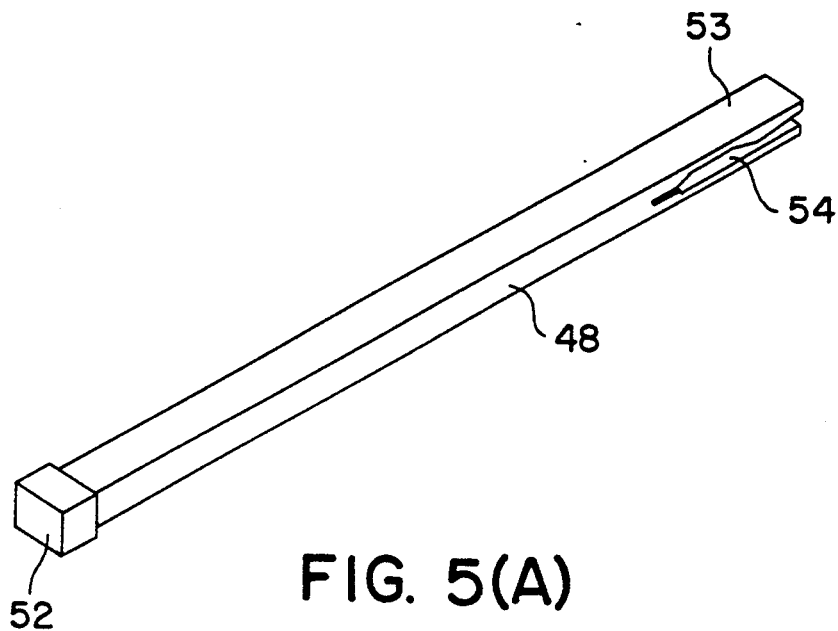
FIG. 5(A) is a top perspective view of the ejection bar of FIG. 1.
Figure 5B:
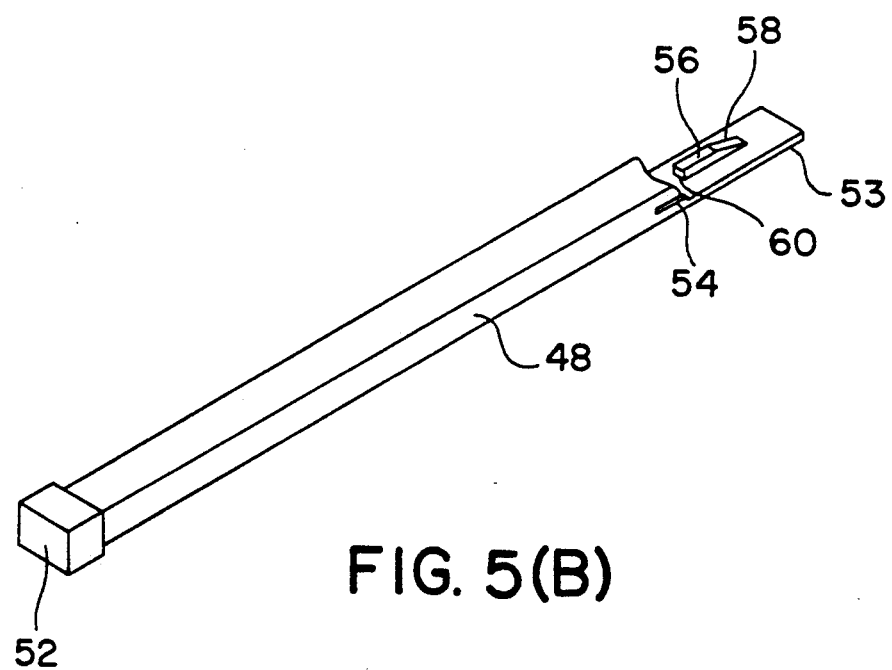
FIG. 5(B) is a top perspective partially exploded view of the ejection bar of FIG. 5(A) to show the inner terrace structure.

Ejection mechanism includes an ejection bar 48 slidably partially positioned within an ejection bar receiving cavity 50, which is parallel located beside the left side guide arm 16 with an ejection button 52 protruding outside, referring to FIGS. 1, 4, 5(A) and 5(B). A yoke type portion 53 is formed at the front end of the ejection bar and is exposed outside for reception of the corresponding portion of a lever. Extending rearwardly from the front end of the ejection bar 48 is a generally horizontal slot 54 which forms a non-linear configuration along its upper edge for corresponding to a terrace 56 formed in the bottom portion of the slot 54, as shown in FIG. 5(B). The terrace 56 has a tapered section 58 in the front for easy insertion of a lever 62 which incorporates a slide plate 72 to move the card (not shown) and will be described in detail later. A shoulder 60 is formed at the rear end of the terrace 56 for retention of the lever 62 within the slot 54 that will be described later.

Figure 6:
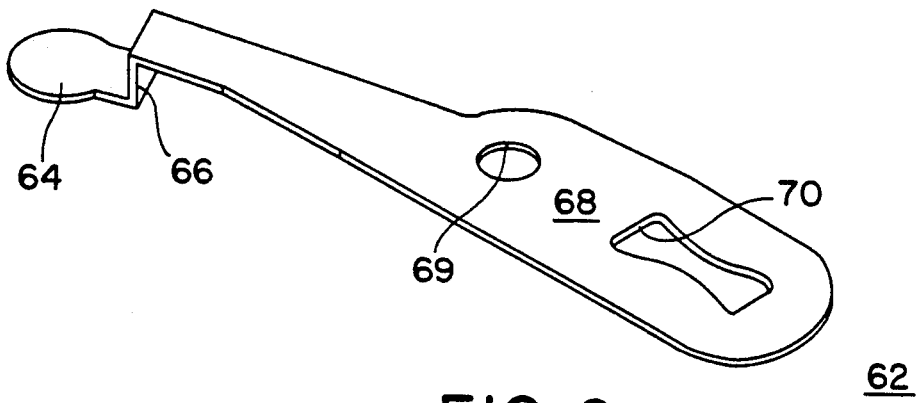
FIG. 6 is a top perspective view of the lever of FIG. 1.

Referring to FIGS. 1 and 6, the elongated lever 62 is formed of a flat metal plate and has a round engaging portion 64 at one end which can pass the tapered section 58 of the terrace 56 and subsequently over the terrace 56 and abut against the shoulder 60 of the terrace 56 during assembling of the lever with the ejection bar 48. It can be understood that the yoke portion 53 of the ejection bar 48 can be expanded outward for insertion of the engaging portion 64 of the lever 62 when assembling. An offset 66 is positioned between the engaging portion 64 and the main plane 68 of the lever 62 for compensation of height difference because the main plane 68 is intentionally positioned on the top of the connector housing 12 while the engaging portion 64 is positioned beside the left side guide arm 16. A narrowed waist type actuating opening 70 is positioned proximate one end of the main plane 68 for receiving and actuating a projecting wall 74 of the sliding plate 72 that will be illustrated later. A rivet hole 69 is positioned between the opening 70 and engaging portion 64 on the main plane 68. To facilitate the rotation of the lever under the situation of structural configuration limitations, the engaging portion 64 has a deflection of its extension direction in comparison with the lengthwise direction of the main plane 68. Also, for the same reason, there is a recess 67 disposed on the top of the main body 14 (FIG. 4) for receiving the portion around the opening 70 of the lever 62 when the card is inserted within the second recess 38 of the connector housing 12.

Figure 7:
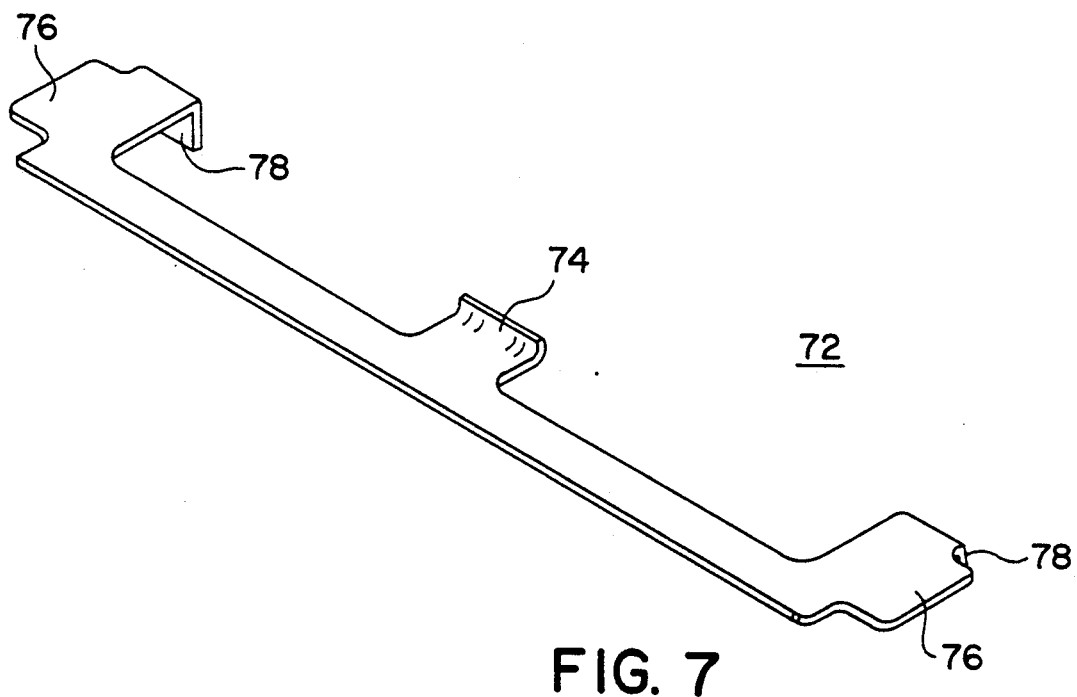
FIG. 7 is a top perspective view of the sliding plate of FIG. 1.

Referring to FIGS. 1 and 7, an elongated sliding plane 72 is disposed on the top of the housing 12 and below the lever 62 wherein in the middle the projecting wall 74 extends a little upwardly for engagement with the opening 70 of the lever 62, two guiding sections 76 respectively extend laterally for being seated on two rear portions 24, 26 of the side guide arms 16, 18 approximate the intersection portions with the main body 14, and a pair of pushing walls 78 transversely extend downwardly from two opposite ends of the sliding plate 72. To correspond to the pushing walls 78, there are two indents 80 (FIG. 4) are provided around the corners of the main body 14 and two side guide arms 16, 18. It can be understood that the pushing walls 78 may be received in the corresponding indents 80 of the main body 14 of the housing 12 when the front edge of the card is butted against the mating face 82 of housing 14. To restrict the lateral movement of the sliding plate 72, a pair of retention bars 84 lie lengthwise at the top surfaces of the two side guide arms 16, 18 and by two sides of the sliding plate 72 so that the sliding plate 72 is only allowed to move in the front-to-back direction.

Figure 8:
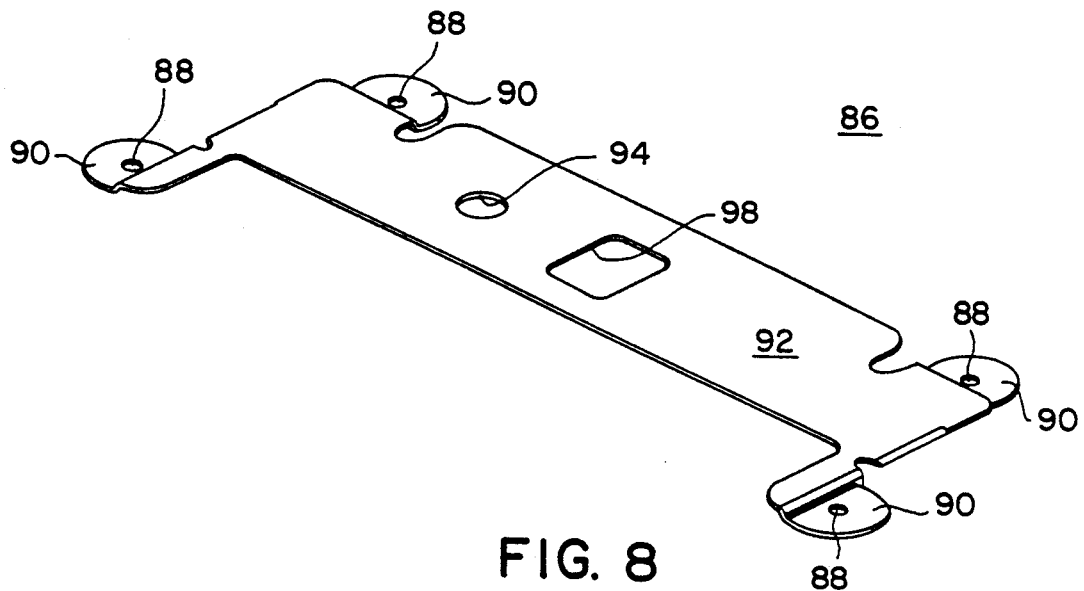
FIG. 8 is a top perspective view of the fixed plate of FIG. 1.

Referring to FIGS. 1 and 8, to fasten the lever 62 and the sliding plate 72 to the housing 12, an elongated fixed plate 86 is positioned on the top of the housing 12 wherein four screws (not shown) respectively extend through four mounting ear holes 88 of the mounting ears 90 of the fixed plate 86 and are locked within the corresponding screw holes 91 (FIG. 4) in the side guide arms thus pressing the mounting ears 88 against the housing 12 so that the upper lever 62 and lower sliding plate 72 can be appropriately slidably or swingably sandwiched and retained between the fixed plate 86 and the housing 12 for operation. It is noted that those four mounting ears 90 are downwardly offset from the main plane 92 so that there is a space formed below the main plane 92 of the fixed plate 86 and above the top surface of housing 12 for operatively receiving the lever 62 and the sliding plate 72. It can been seen that the engaging portion 64 of the lever 62 laterally projects out of fixed plate 86 from such space between the left edge of the main plane 92 of the fixed plate 86 and the top surface of the housing 12 in order to latchably engage the yoke portion 53 of the ejection bar 48.

To have the lever 62 properly pivot relative to the housing 12 for effectively actuating the sliding plate 86, a rivet (not shown) extends through the rivet hole 94 of the fixed plate 86 and the rivet hole 69 of the lever 62 and fastens the fixed plate 86 and the lever 62 together with permission of pivotal movement of the lever 62 thereabout. A properly sized window 98 is positioned in the middle of the main plane 92 of the fixed plate 86 not only for observing the operative engagement of the actuating opening 70 of the lever 62 and the projecting wall 74 of the sliding plate 72, but also for restraint of the lengthwise movement of the projecting wall 74 and/or the sliding plate 72 because the projecting wall 74 extends almost flush with the top surface of the main plane 92 of the fixed plate 86 in the window 98.

Figure 9:
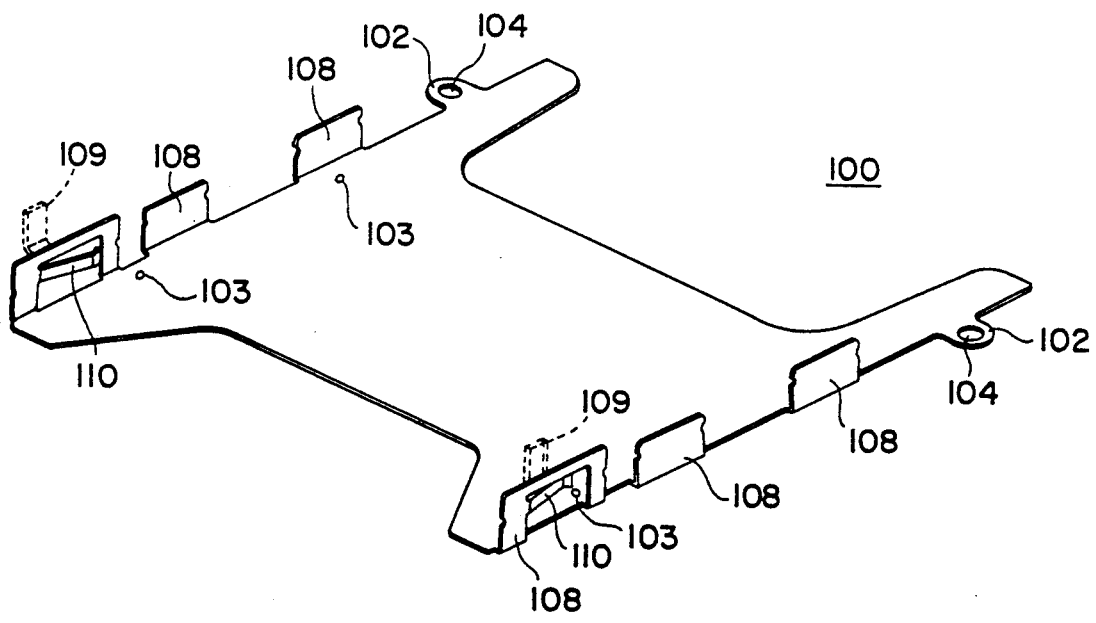
FIG. 9 is a top perspective view of the reinforcement plate of FIG. 1.

Referring to FIGS. 1, 4 and 9, the housing 12 further comprises three pairs of through-slots 99 extending vertically along two side guide arms 16 and 18 for engagement with an auxiliary reinforcement plate 100 which enhances the strength of the whole structure, and especially prevents the deflection of the rear portions 24, 26 of the side guide arms 16, 18.

The reinforcement plate 100 has a pair of opposite mounting ears 102 each including a hole 104 thereof positioned at two opposite sides of the reinforcement plate 100 respectively for alignment with a pair of screw holes 106 positioned in the housing 12 so that a pair of screw (not shown) can extend therethrough for mounting the housing 12 associated with the reinforcement plate 100 on the board (not shown). The reinforcement plate 100 has three pairs of retention tabs 108 extending upwardly form two opposite edges of the reinforcement plate 100 and having lateral barbs for interferential reception in the corresponding through-slots 99, respectively, so that the reinforcement plate 100 can be latchably attached to the housing 12. Each of the outermost pair of retention tabs 108 further has a tang 110 inwardly projecting into the second recess 38 in the housing 12 for capturing electrostatic charges accumulated on the surface of the inserted card for ESD protection. The reinforcement plate 100 future optionally includes four downward dimples 103 (only three shown) proximate two side portions for engagement with the corresponding holes in the board for the consideration of retention and grounding aids with the board on which the connector is mounted.

Figure 14A:
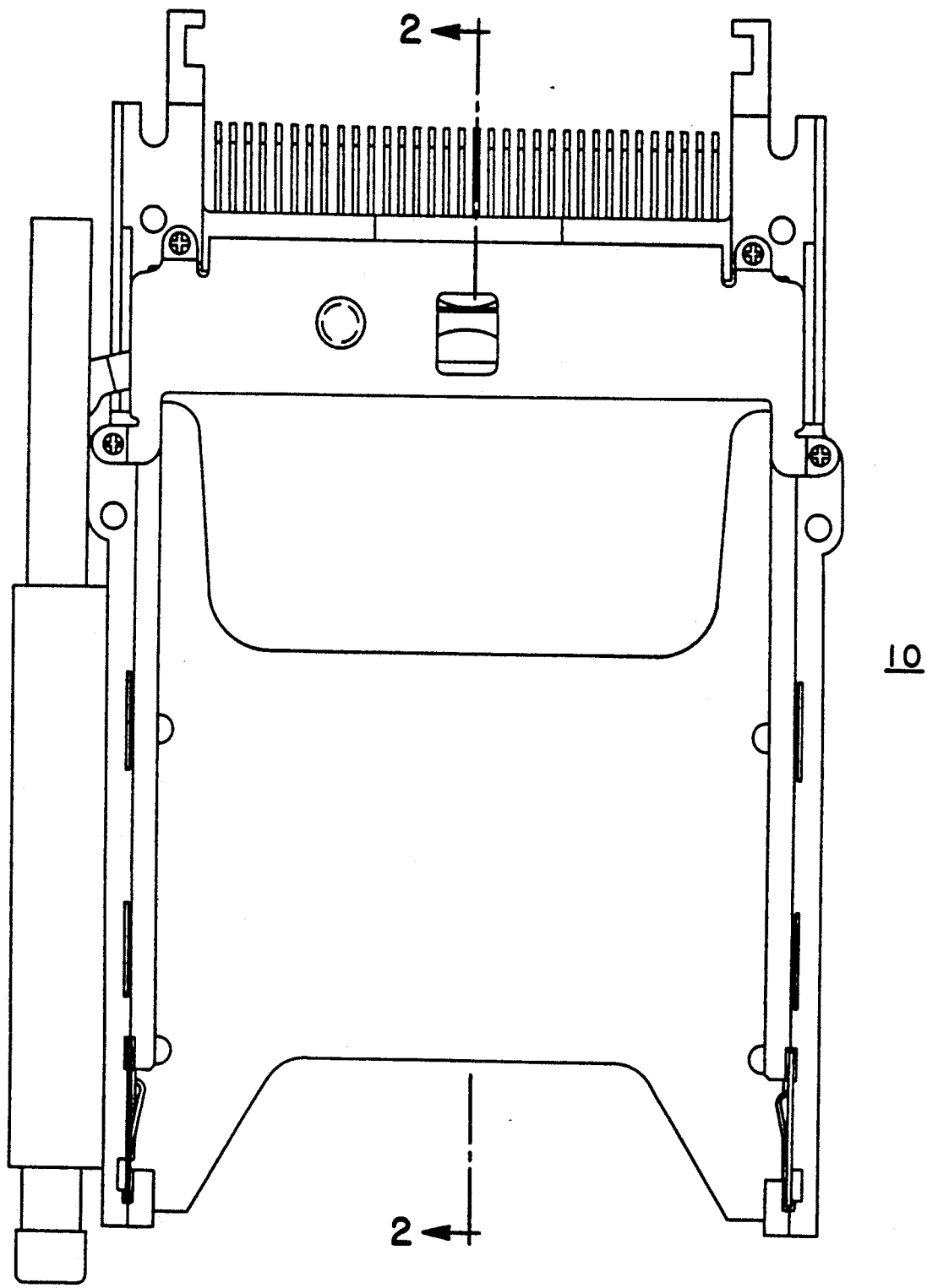
FIG. 14(A) is a top view of an single assembled connector of FIG. 1.
Figure 14B:
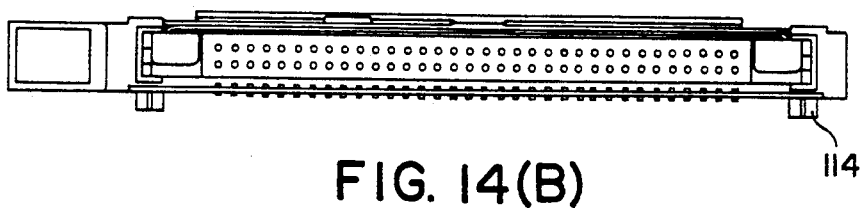
FIG. 14(B) is an front view of the assembled connector of FIG. 14(A).
Figure 14C:
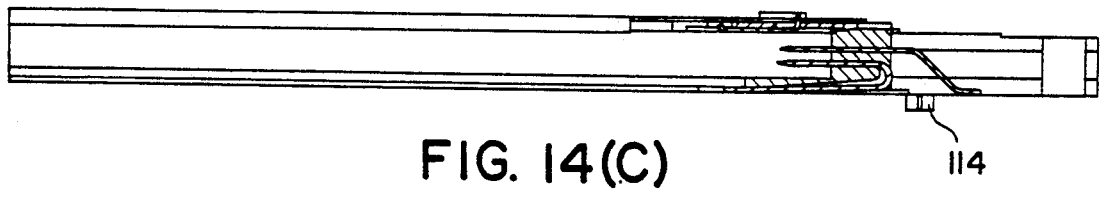
FIG. 14(C) is a side cross-sectional view of the assembled connector of FIG. 14(A) taken along line 2—2.
Figure 14D:
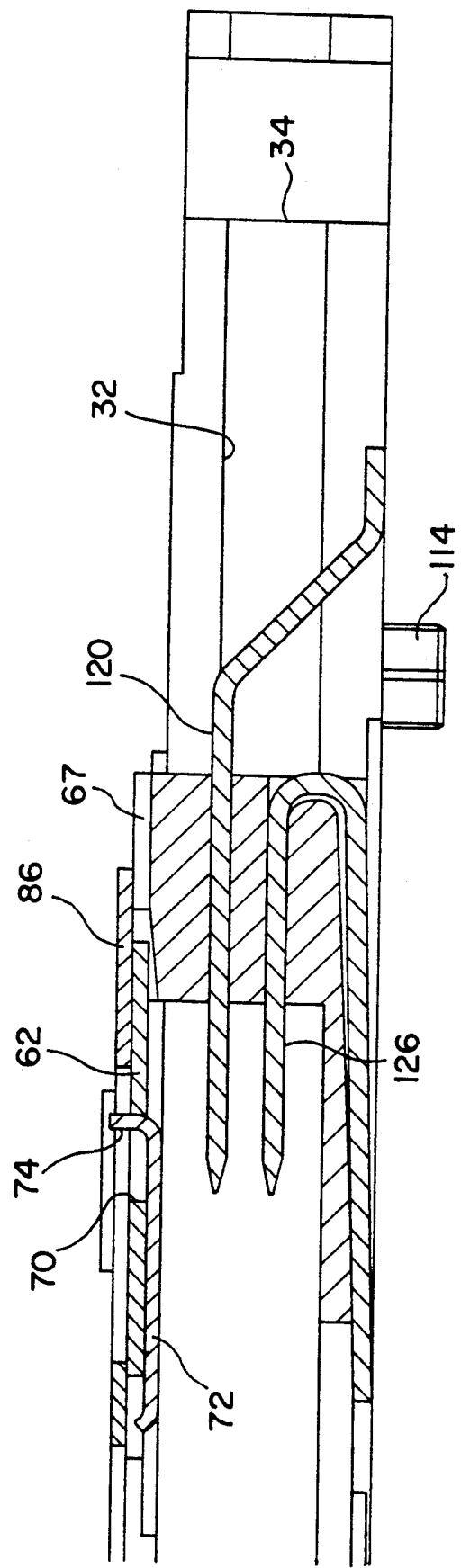
FIG. 14(D) is an enlarged partial view of the assembled connector of FIG. 14(C) showing the structural vertical relationship among the fixed plate, the lever and the sliding plate.
Figure 15A:
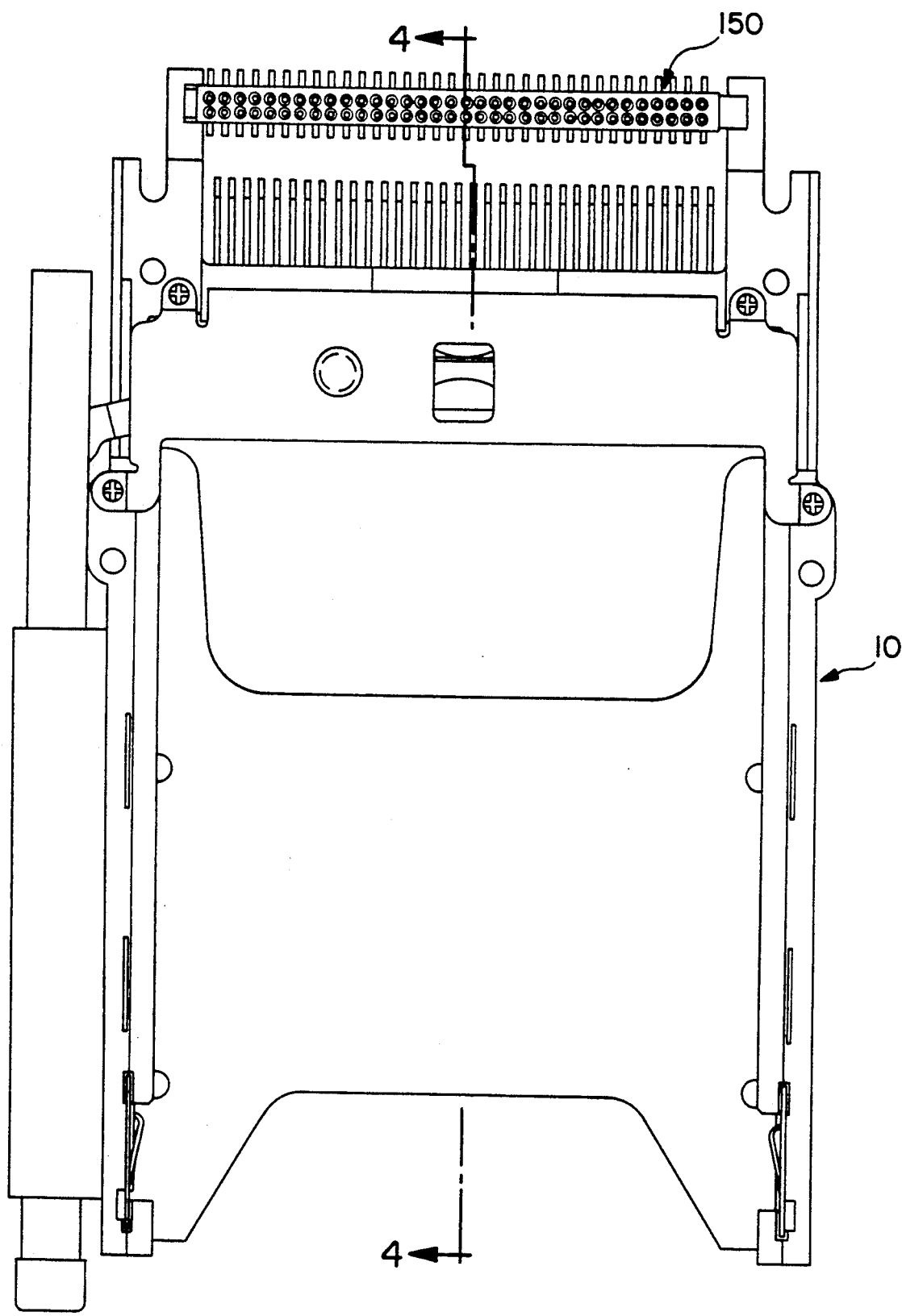
FIG. 15(A) is a top view of the assembled lower connector equipped with the auxiliary socket when two connectors are stacked together.
Figure 15B:
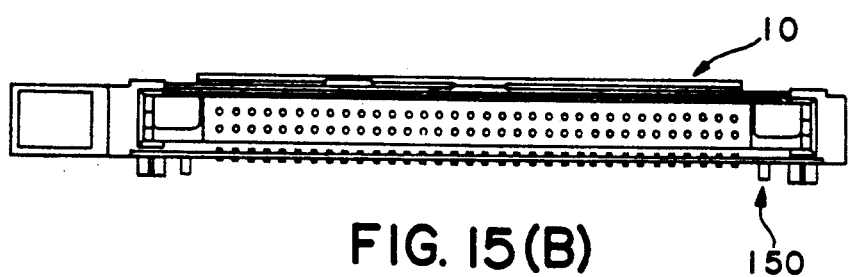
FIG. 15(B) is a front view of the semi-finished connector assembly of FIG. 15(A).
Figure 15C:
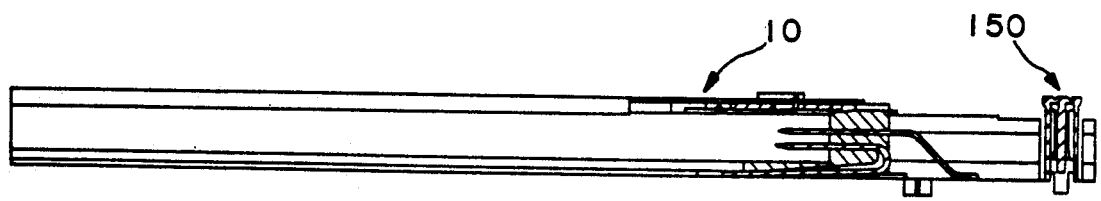
FIG. 15(C) is a side cross-sectional view of the semi-finished connector assembly of FIG. 15(A) taken along line 4—4.

Referring to FIG. 4, the housing 12 further comprises a pair of post holes 112 extending downwardly approximate the intersection portions of the main body 14 and two front portions 20, 22 of the side guide arms 16, 18. Opposite to each post holes 112, referring to FIGS. 14(B), 14(C) and 14(D), a post 114 (not shown in FIG. 4). extends downwardly from the bottom surface of the housing 12 for reception within the corresponding holes of the main board (not shown) on which the connector is seated or within the corresponding post holes 112 of another connector on which the connector is stacked.

Tune fork sections 116 are respectively positioned at the end of the front portions 20, 22 of the side guide arms 16, 18 for receiving the corresponding clamping screws (not shown) to fasten the connector onto the board.

Figure 13A:
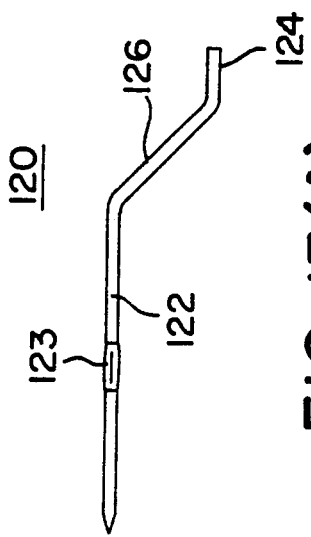
FIG. 13(A) is a side view of the upper row contact used in the lower, if stacked, or single connector.
Figure 13B:
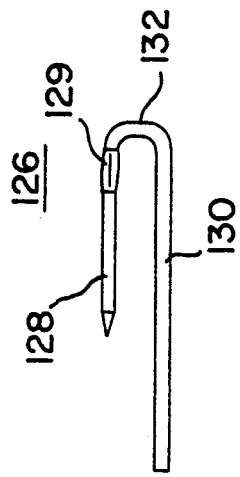
FIG. 13(B) is a side view of the lower row contact used in the lower or single connector.

Referring to FIGS. 13(A), 13 (B), 14(C) and 14(D), when the connector is single used on the board, each upper row contacts 120 has a horizontal main portion 122, a short tail 124 and a slanting portion 126 intermediating therebetween wherein the main portion 122 is received within and extends through the corresponding upper row passageway 28 of the main body 14 of the housing 12 and the tail 124 extends forwardly and is solderably seated on the board on which the connector is seated. Each lower row contact 126 has a generally U-shaped configuration including a main portion 128, a long slightly oblique tail 130 and a bight 132 intermediating therebetween wherein the main portion 128 is received within and extends through the corresponding lower row passageway 28 and the tail 130 projects rearwardly for reception within the corresponding aligning channel 46 of the supporting plate 45 and the end of the tail 130 solderably abuts against the board. It is also noted that each contact, regardless of the upper one or the lower one, has an expansion section 123, 129 on its main portion for retention of the contact 120, 126 within the corresponding passageway 28 of the housing 12.

When a single connector is used on the board, the reinforcement plate 100 is loaded to the housing 12 form the bottom. The posts 114 are retained within the corresponding holes in the board. The connector housing 12 is securely fixed on the board by four screws extending through the screw holes 106 and the tune fork sections 116, and locked with the board. Four dimples 103 of the reinforcement plate 100 may appropriately abut against the corresponding holes in the board. The tails 120, 126 are respectively conductively soldered on the corresponding traces on the board. The memory card can be inserted into the second recess 38 of the housing 12 from the rear along the opposite trails 40, 42 of the left and the right side guide arms 16, 18 until the front edge of the card butts against the mating surface 82 of the main body 14 of the housing 12. During this insertion, the electrostatic charges accumulated on the outer surface of the card can be removed by means of the confrontation with the tangs 110 of the reinforcement plate 100 through the dimples 103 and the mounting ears 102 to the grounding traces on the board for ESD protection. At this stage, the card is positioned in its operative position and the actuating opening 70 associated with therein the projecting wall 74 and the sliding plate 72 is positioned at the front position, so the pushing walls 78 are respectively located within the indents 80 of the housing 12. In contrast, the engaging portion 64 of the lever 62 associated with the yoke portion 53 and the ejection bar 48 is positioned at the rear position. When the memory card is required to be withdrawn, the ejection bar 48 is moved forwardly by manually pushing the button 52 forwardly so that the engaging portion 64 of the lever 62 is moved forwardly by the yoke portion 53 of the pushing bar 48 thus making the lever 62 clockwise rotates about the axis of the rivet which extends through the rivet hole 69. Therefore, the 15 actuating opening 70 of the lever 62 will be moved rearwardly and drag the inner projecting wall 74 of the sliding plate 72 to the same direction so that the sliding plate 72 is moved rearwardly and pushes the memory card rearwardly out of the second recess 38 by its two opposite pushing walls 78. The operation of ejection and its principle in the present invention is similar to that in the prior art connector, as disclosed in U.S. Pat. No. 5,197,894 and will not further be illustrated in detail hereinafter.

The assembled structure of the connector can be referred to FIGS. 14(A)-(D).

Figure 2:
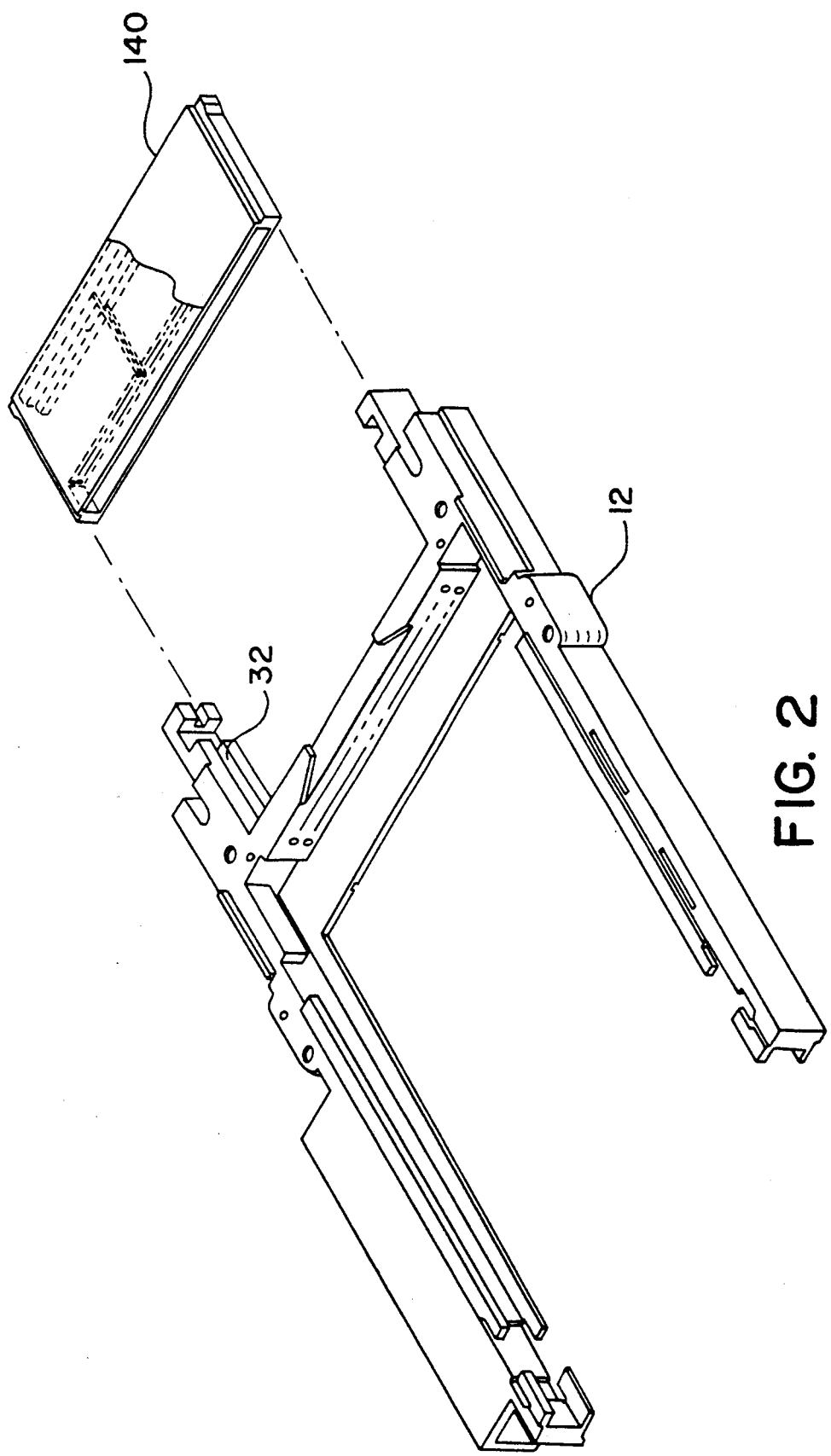
FIG. 2 is a top perspective view of the connector housing of FIG. 1 accompanying an alignment comb.
Figure 3:
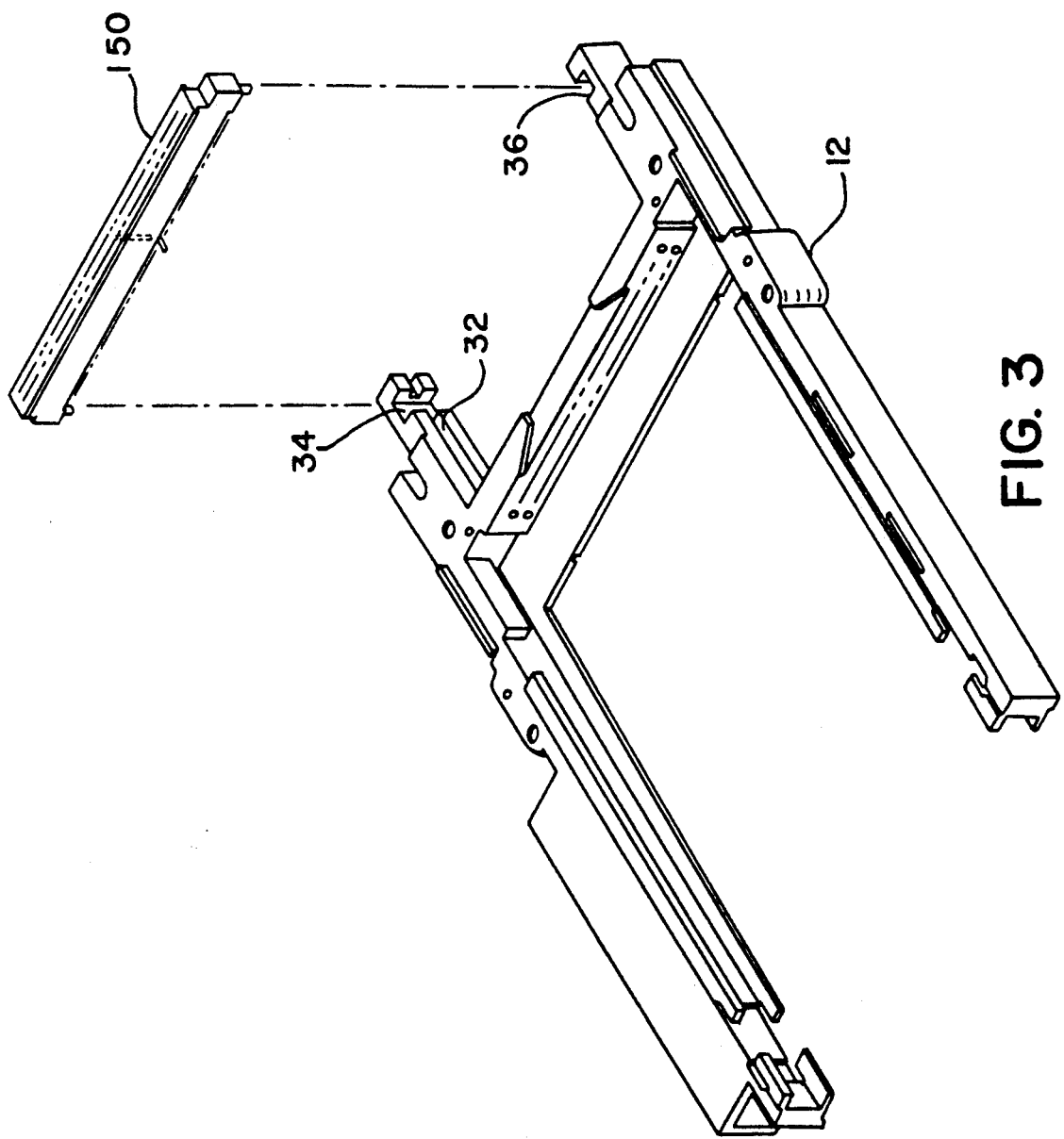
FIG. 3 is a top perspective view of the connector housing of FIG. 1 accompanying an auxiliary socket.
Figure 10:
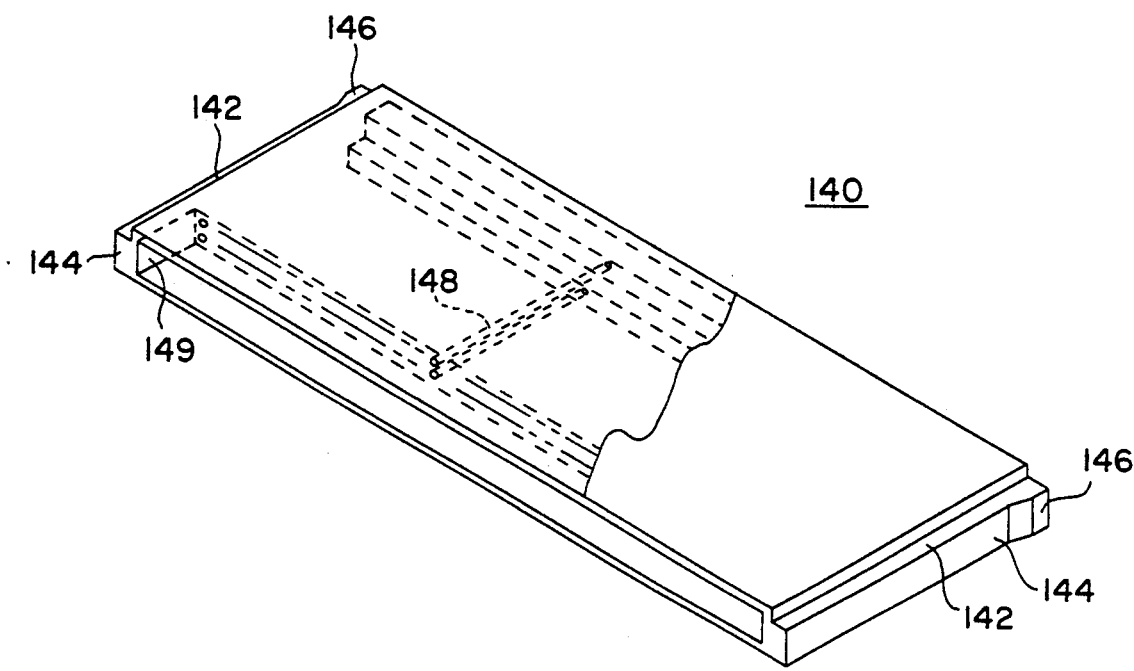
FIG. 10 is a top perspective view of the alignment comb of FIG. 2.

As shown in FIGS. 16(A)-(D), when two (upper and lower) similar connector housings 12 are stacked together in operation, the alignment comb 140 and the auxiliary socket 150 are required to be respectively attached to the front portions 20, 22 of the side guide arms 16, 18 of these two stacked connector housings 12. Referring to FIGS. 2 and 10, the alignment comb 140 includes two steps 142 at two opposite upper edges so that the thinner portions 144 can be compactly inserted into the first recess 30 of the housing 12 from the front and accommodated within the groove 32 formed in the front portions 20, 22 of the side guide arms 16, 18 until the alignment comb 140 confronts the main body 14 of the housing 12 of the upper connector 10 Accordingly, the alignment comb 140 can be retained in the first recess 30 of the housing 12 by an interference of the expansion legs 146 with the inner surfaces of the front portions 20, 22 of the side guide arms 16, 18. Two rows of the passageways 148 extend through the alignment comb 140 in the front-to-back direction.

Attention has been directed to the situation that each passageway 148 is laterally offset to its corresponding passageway 28 of the upper connector housing 12. This offset is to correspond to the conductive traces and their circuit paths layout printed on the board because four rows traces are not desired to be configured under the condition that each column of these gathered traces has more than two traces thereof. Accordingly, the traces for the upper connector contact tails and those for the lower connector contact tails are staggered with each other so that the upper connector contact tails are arranged in an offset condition relative to the lower connector contact tails.

Figure 13C:
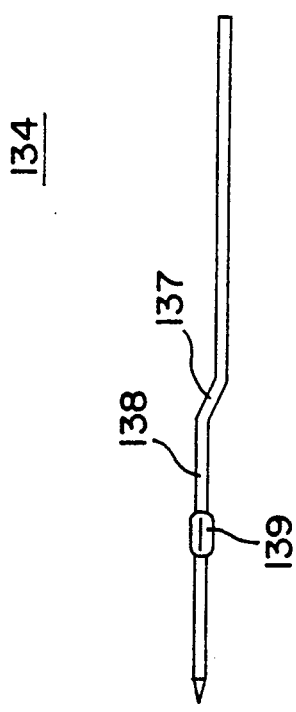
FIG. 13(C) is a top view of the contact used in the upper connector if stacked.
Figure 13D:
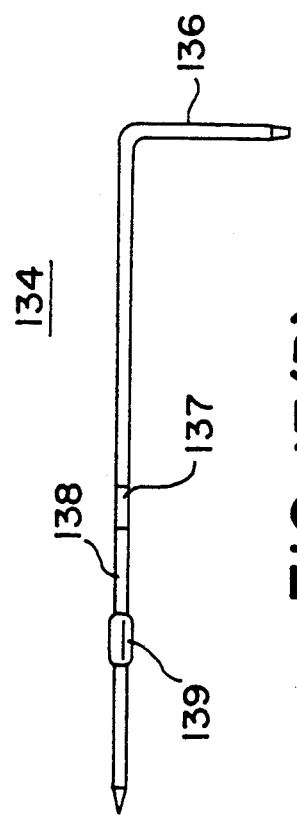
FIG. 13(D) is a side view of the contact of FIG. 13(C).

Referring to FIGS. 13(C) and 13(D), different from the lower connector contact as disclosed in the aforementioned single connector, each upper connector contact 134 has a right angle tail 136 integrally extending from its main portion 138. The main portion 138 has an offset 137 in the horizontal direction in order to have the tail of the upper connector contact can be staggered with the tail of the corresponding lower connector contact. Similar to the lower connector, each upper connector contact has an expansion section 139 for retention within the corresponding passageways 28, and the main portion of each upper row contact is little bit longer than that of the lower row contact for mating with the corresponding traces on the board. To correspond to the different lengths of the upper row contact 134 and the lower row contact 134 in the upper connector housing 12, the alignment comb has a step structure at the rear for support, as shown in FIGS. 10, 16(C) and 16(D).

It can be understood that it is intended that the offset 137 of each upper connector contact 134 is positioned on the horizontal portion, i.e., main portion, of the contact and it is improper to position the offset approximate the right angle portion due to the consideration of manufacturing bending limitation and the stress concentration. Accordingly, in this embodiment of the present invention, the offset 137 is disposed in the middle of the main body 138 the contact 134 for easy manufacturing and strength consideration, and thus the alignment comb 140 has a cavity 149 almost extending along the entire lateral length for accommodating the offset 139 of each contact 134.

Figure 11:
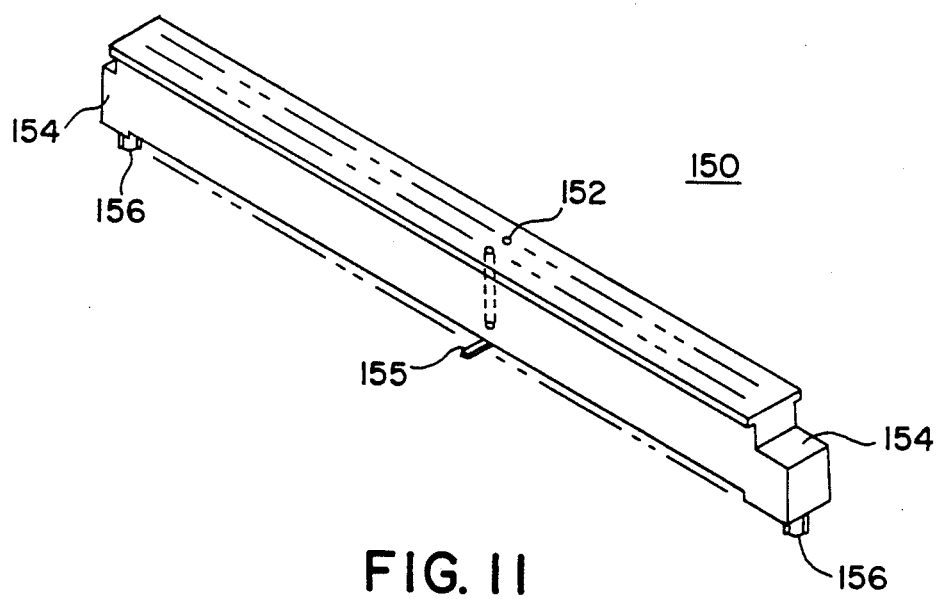
FIG. 11 is a top perspective view of the auxiliary socket of FIG. 3.
Figure 12:
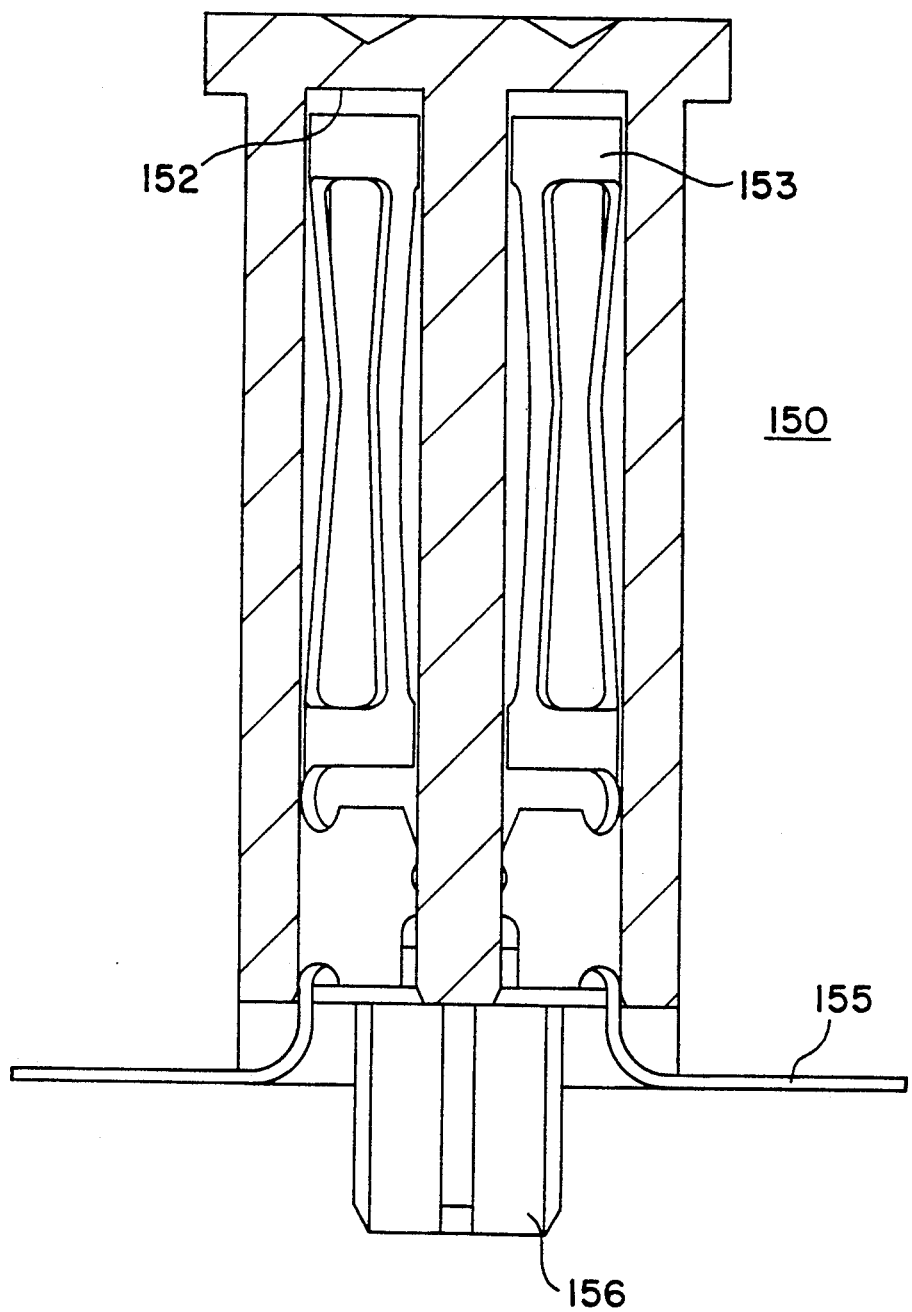
FIG. 12 is a cross-sectional view of the auxiliary socket of FIG. 11 illustrating the contact therein.

Referring to FIGS. 3 and 16(A)-(D), corresponding to the alignment comb 140 positioned between two front portions 20, 22 of the side guide arms 16, 18 of the upper connector housing 12, the auxiliary socket 150 is inserted into the vertical grooves 34, 36 of the front portions 20, 22 of the side guide arms 16, 18 of the lower connector housing 12 from the top. Referring to FIGS. 11 and 12, the auxiliary socket 150 has an elongated body, two rows of passageways 152 vertically extending therethrough. Each passageway 152 receives a female contact 153 having a horizontal tail 155 extending outwardly for surface mount onto the board on which the lower connector is seated. Two engaging ears 154 are disposed at two ends of the elongated body of the auxiliary socket 150 for interferentially engaging reception within the grooves 34, 36 of the front portions 20, 22 of the side guide arms 16, 18 of the lower connector housing 12. Each engaging ear has a post 156 extending downwardly from the bottom surface for interferential reception within a corresponding hole in the board for retention.

Figure 16A:
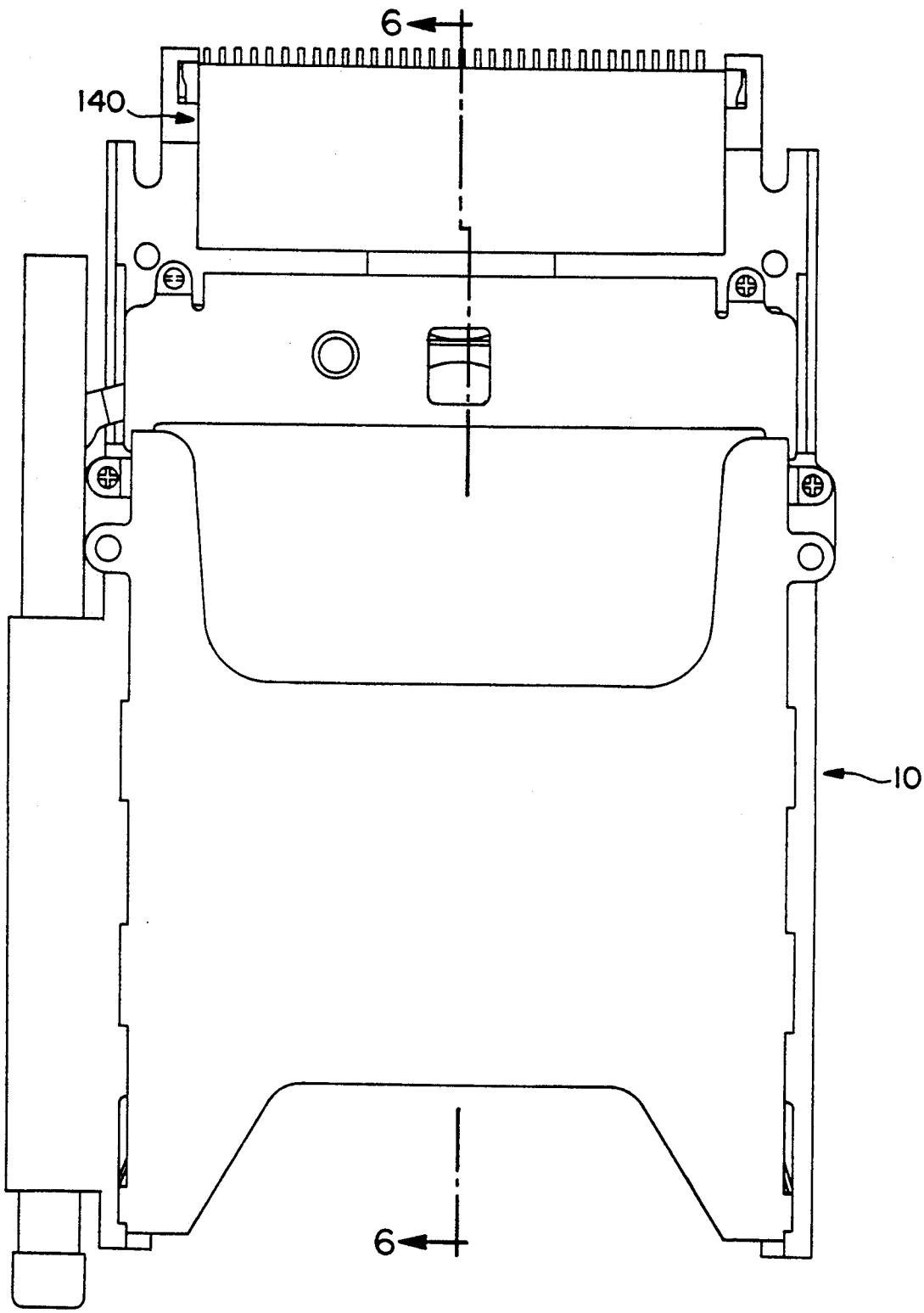
FIG. 16(A) is a top view of the final assembled connector assembly including the upper connector equipped with the alignment comb and the lower connector equipped with the auxiliary socket when they are stacked together.
Figure 16D:
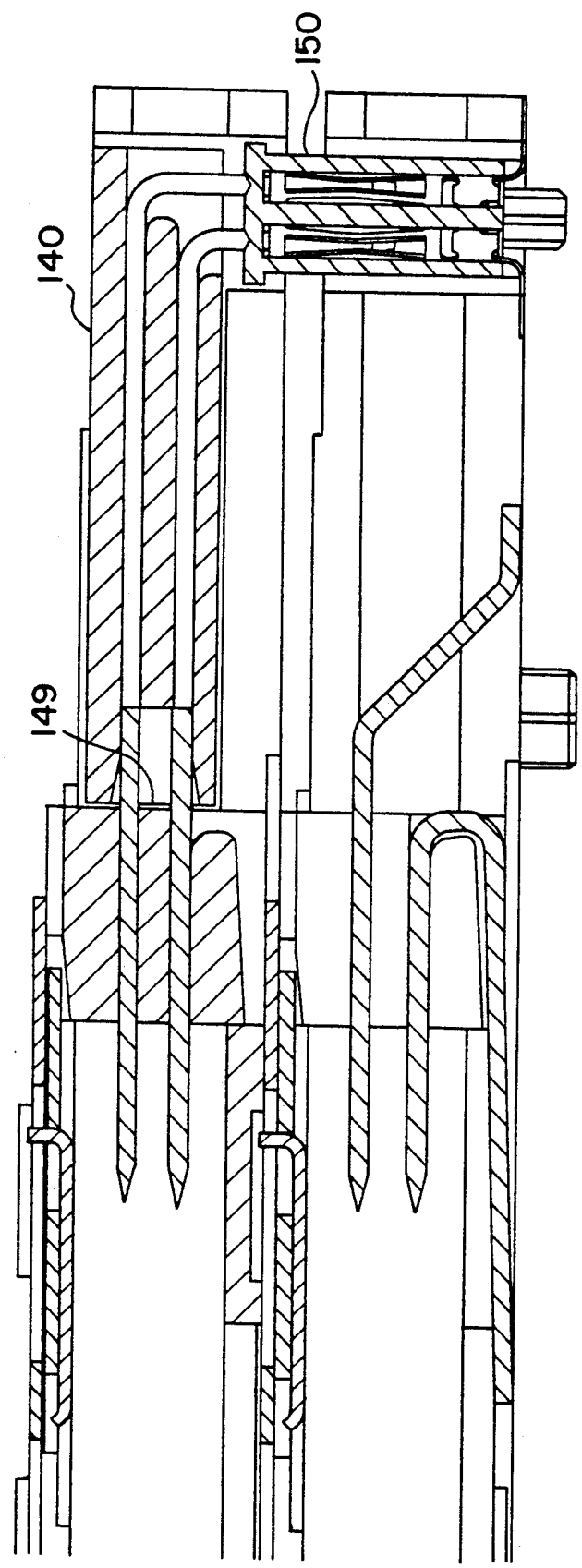
FIG. 16(D) is an enlarged partial view of the final assembled connector assembly showing the mating between the contacts of the alignment comb and the contacts of the auxiliary socket.

Referring to FIGS. 16(C) and 16(D), the passageways 152 of the auxiliary socket 150 which is properly positioned in the lower connector is designedly aligned with the tails 136 of the corresponding upper connector contacts 134 extending out of the alignment comb 140 so that each tail 136 of the upper connector contact 134 can be engagingly received in the corresponding female contact 153 of the auxiliary socket 150.

It is appreciated that during assembling, the upper connector contacts 134, the tails 136 of which have not been bent at a right angle type, are inserted into the corresponding passageways 28 of the upper connector housing 12 from the front first, and successively the alignment comb 140 is moved rearwardly from the front along the groove 32 of the upper connector housing 12 whereby each unbent tail 136 of the upper connector contact 134 can pass through the corresponding passageway 148 of the alignment comb 140 until the alignment comb 140 confronts the main body 14 of the housing 12. Then, the tails 136 of the upper connector contacts 134 are simultaneously bent downwardly so that the upper connector housing 12 and its associated alignment comb 140 are formed as a first semi-finished assembly which is ready for mating with the lower connector assembly.

On the other hand, the auxiliary socket 150 is attached to the lower connector housing 12 from the top by the engagement of the engaging ears 154 of the auxiliary socket 150 within the grooves 34, 36 of the front portions 20, 22 of the side guide arms 16, 18 of the lower connector housing 12. Similarly, the lower connector housing 12 and its associated auxiliary socket are formed as a second semi-finished assembly.

Consequently, the second semi-finished assembly is located onto the main board and able to be temporally retained on the board by the engagement of the posts 156 of the auxiliary socket 150 and the housing post 114 with the corresponding holes in the board whereby the contact tails 124, 130 of the lower connector 10 and the tails 155 of the auxiliary socket 150 are seated on the corresponding printed traces on the board and ready to be soldered. Successively, the first semi-finished assembly is, from the top, loaded onto and vertically aligned with the second semi-finished assembly. The posts 114 of the upper connector housing 12 can be received within the corresponding holes 112 of the lower connector housing 12 and the tails 136 of the upper contact 134 can appropriately conductively received within the corresponding aligned female contact 153 of the auxiliary socket 150. The stacked first semi-finished assembly and the second semi-finished assembly can be combined as a final unit and fastened to the main board on which they are seated by four screws extending through their corresponding tune fork sections 116 and the screw holes 106 on the side guides arms 16, 18. At last, the contact tails (including the upper connector contact tails 136, the lower connector contact tails 124, 130 and the female contact tails 155 are simultaneously soldered to the corresponding traces on the main board.

It can be contemplated that the structure of the present invention not only prevents misalignment of the upper connector contacts, but also keep the compact size for the whole unit when two connectors are stacked together. Moreover, the associated components such as the alignment comb and the auxiliary socket, can be attached to the corresponding relevant connectors forming a semi-finished assembly, thus making the assembling process become easy and orderly. In addition, the whole assembly unit is of a solid form in comparison with the previous art connector assembly using a flexible flat cable thereof.

It can be appreciated that for cost-saving consideration, only using the alignment comb 140 with the upper connector housing 12 to control the horizontal alignment of the upper connector contacts or only using the auxiliary socket 150 with the lower connector housing 12 to control the vertical alignment of the upper connector contacts may still work for the whole assembly, even though it is inferior to the combination use of these two alignment means, while it is still superior to the operation of the prior art connectors having no alignment means thereof.

It is appreciated that in this embodiment the upper connector housing 12 and the lower connector housing 12 are totally same so that only one type ejection mold is used to manufacture both the upper connector housing 12 and the lower connector housing 12 in the present invention for cost-saving consideration in mass production.

In this embodiment, it is noted that when two connectors housings 12 are stacked together and the reinforcement plate 100 is desired to be attached to each connector housing 12 for either enhancement of the side guide arm structure or ESD protection, the reinforcement plate 100 of the upper connector housing 12 is loaded thereto from the top and that is different from the bottom loading of the reinforcement plate 100 in the lower connector housing 12 or in a single connector housing 12. Thus, a larger space can be obtained between these two oppositely facing spaced reinforcement plates 100 so that the traditional three different thickness type memory cards can be selectively and optionally used with the stacked whole connector assembly in the present invention. In contrast, most prior art connectors always have fixed plates at the bottom incorporating ejection mechanism so that it is impossible for a thicker IC memory card inserted into the space between those two fixed plates if two stacked prior art connectors have been installed in the computer. That is, in the present invention when two connector are stacked together, the reinforcement plate 100 of the upper connector is attached on the top surface of the upper connector housing and the reinforcement plate 100 of the lower connector is attached on the bottom surface of the lower connector housing so that a bigger space of almost two-housing thickness between these two opposite reinforcement plates 100 is ready to receive either a thin or a thick memory card therein. Differently, most prior art memory card connectors provide the fixed plate attached thereof in only one position, generally on the bottom position as disclosed in U.S. Pat. No. 5,161,989, so that the space between two opposite fixed plates is always kept as only one-housing thickness when two same prior art memory card connectors are stacked together, thus preventing a thicker memory card from being used between the space of these two opposite fixed plates. Accordingly, the present invention is more flexible in use than the prior art connector.

It can be seen that the reason why in the present invention the reinforcement plate 100 can be optionally attached to the connector housing 12 either on the top or on the bottom is that the ejection mechanism in the present invention is positioned approximate on the top of the main body 14 of the housing 12 and that is far different from the most conventional ejection mechanism of the prior art connectors which are disposed on the bottom fixed plates thereof. Therefore, the reinforcement plate 100 in the present invention can be optionally attached to the top or the bottom of the connector housing 12 without any consideration of the ejection mechanism installation, and achieve the aforementioned advantages. Certainly, the reinforcement plate 100 also provides anti-dust or anti-impact protection functions in the vertical direction.

It is also understood that in the present invention the ejection mechanism is positioned at the top of the connector housing 12 and the window 98 of the fixed plate 86 is exposed to the outside, so that the operation of the actuating opening 70 of the lever 62 with the projecting wall 74 of the sliding plate 72 can be observed even though the card is inserted into the connector housing 12, thus making it easy during assembling or adjustment if required. The ejection mechanism which is positioned approximate on the top of the main body 14 of the housing 12, also facilitates low profile design for the connector.

It is also noted that in the present embodiment the reinforcement plate 100 used in the upper connector housing 12 has a little difference to that used in the lower connector housing 12. As shown in FIG. 9, an elongated tongue 109 (shown in dash-line) extends from the last tab 108 of the reinforcement plate 100 of the upper connector 10 and can project into the cavity 97 beside the corresponding slot 99 in the side guide arm 16, 18 of the lower connector housing 12, and contact thereabout the corresponding tab 108 of the reinforcement plate 100 of the lower connector housing 12 for grounding. Because the reinforcement plate 100 of the lower connector housing 12 is conductively connected to the circuit path on the board through the mounting ears 90 and the dimples 103 contacting the corresponding traces on the board, thus any electrostatic charges of the card inserted into the upper connector housing 12 also can be removed through this connection conductive path.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A memory card connector assembly for use with at least a memory card including:
   two stacked upper and lower connectors each including:
   a generally H-shaped housing comprising a main body through which a plurality of contacts extend;
   two parallel side guide arms positioned at two ends of the main body;
   a first recess formed among two front portions of the side guide arms and the main body for reception of an alignment comb and/or an auxiliary socket therein; and
   a second recess formed among two rear portions of the side guide arms and the main body for reception of the memory card; wherein
   said alignment comb is positioned in the first recess of the upper connector for horizontal alignment of the contacts of the upper connector and said auxiliary socket is positioned in the first recess of the lower connector for vertical alignment of the contacts of the upper connector.

2. The memory card connector assembly as described in claim 1, wherein the auxiliary socket has a plurality of contacts extending vertically for conductively receiving tails of the corresponding contacts of the upper connector therein.

3. The memory card connector assembly as described in claim 1, wherein each housing has a horizontal groove and a vertical groove in each front portion for receiving the alignment comb and the auxiliary socket, respectively.

4. The memory card connector assembly as described in claim 1, wherein a reinforcement plate is attached to a bottom surface of the lower connector, another reinforcement plate is attached to a top surface of the upper connector, and these two reinforcement plate are conductively connected through at least an elongated tongue, each reinforcement plate comprising a pair of tangs extending into the corresponding second recess for ESD protection when the memory card is inserted therein.

5. The memory card connector assembly as described in claim 1, wherein each connector further comprises ejection mechanism for withdrawal of the inserted card, said ejection mechanism including an ejection bar positioned beside one of said side guide arms, a lever and a sliding plate positioned on the top of the housing and proximate the main body, whereby the lever is swingably operated by the ejection bar and simultaneously actuates the sliding plate to push the inserted memory card out of the housing.

6. The memory card connector assembly as described in claim 1, wherein each housing has a plurality of passageways for receiving the corresponding contacts and the alignment comb has a plurality of passageways receiving the corresponding contacts extending from the housing of the upper connector, each passageway of the alignment comb being offset to the corresponding passageway of the housing of the upper connector, and a cavity extending along a lateral length of the alignment comb for accommodating offsets of the contacts of the upper connector therein.

7. A memory card connector for use with a memory card and a PC board on which the connector is mounted, including:
an H-shaped housing having a main body and a pair of parallel side guide arms oppositely positioned at two ends of the main body;
a plurality of passageways extending through the main body in a front-to-back direction;
a plurality of contacts received within the corresponding passageways, respectively;
a first recess formed among two front portions of the side guide arms and the main body for optional reception of an alignment comb and/or an auxiliary socket wherein a horizontal groove horizontally extends along an inner surface of the front portion of each side guide arm in the front-to-end direction so that said alignment comb can be loaded thereto in the front-to-end direction for fixedly interferential engagement therein, and a vertical groove vertically extends along an inner surface proximate an end of the front portion of each side guide arm in a direction perpendicular to a PC board, on which said connector is mounted, so that said auxiliary socket can be loaded thereto vertically for securely interferential engagement therein; and
a second recess formed among two rear portions of the side guides arms and the main body for reception of the memory card.

8. The memory card connector as described in claim 7, wherein a reinforcement plate is adapted to be attached to the housing in both upward and downward directions so that said reinforcement plate can be positioned either on the top or on the bottom.

9. The memory card connector as described in claim 7, wherein the connector further comprises ejection mechanism including an ejection bar positioned beside one side guide arm, a lever and a sliding plate positioned on a top surface of the housing and approximate the main body, one end of the lever connected to the ejection bar and the other end of the lever connected to the sliding plate.

10. The memory card connector as described in claim 9, wherein a fixed plate is positioned on the top of the lever and pivotally connected to the lever through a rivet so that the lever and the sliding plate are sandwiched between the fixed plate and the top surface of the housing and the lever can swingably actuate the sliding to move in the front-to-back direction.

11. The memory card connector as described in claim 9, wherein the housing further comprises a pair of retention bars positioned at two sides of the side guide arms for restraining lateral moving of the sliding plate.

12. The memory card connector as described in claim 8, wherein the reinforcement plate has a pair of tangs extending into the second recess of the housing for ESD protection.

13. A semi-finished upper memory card connector assembly for use with a memory card including:
a connector comprising:
a generally H-shaped housing having a main body and a pair of parallel side guide arms oppositely positioned at two ends of the main body;
a plurality of passageways extending through the main body in a front-to-back direction;
a plurality of contacts inserted into the corresponding passageways, respectively;
a first recess formed among two front portions of the side guide arms and the main body;
a second recess formed among two rear portions of the side guides arms and the main body for reception of the memory card; and
an alignment comb horizontally loaded thereto and received within the first recess and fixedly interferentially engaged with two opposite grooves positioned in said two front portions of said side guide arms, respectively, said alignment comb having a plurality of horizontal passageways extending therethrough in said front-to-end direction and spaced from each other for respective horizontal alignment of the corresponding contacts.

14. The semi-finished upper memory card connector assembly as described in claim 13, wherein the passageways of the alignment comb is offset to the passageways of the housing, respectively.

15. A semi-finished lower memory card connector assembly for use with memory card and an upper memory card connector including:
a connector comprising:
a generally H-shaped housing having a main body and a pair of parallel side guide arms oppositely positioned at two ends of the main body;
a plurality of passageways extending through the main body in a front-to-back direction;
a plurality of contact inserted into the corresponding passageways, respectively;

a first recess formed among two front portions of the side guide arms and the main body;

a second recess formed among two rear portions of the side guides arms and the main body for reception of the memory card; and an auxiliary socket vertically loaded thereto and received within the first recess approximately the front ends of the side guide arms and securely interferentially engaged with two vertical grooves positioned in said two front portions of said side guide arms, respectively, said auxiliary socket having a plurality of vertical passageways extending therethrough in a direction perpendicular to a PC board, on which the connector is mounted, and isolated from each other for respective vertical alignment of the corresponding contacts of said upper connector which is positioned thereon.

16. The semi-finished lower memory card connector as described in claim 15, wherein the auxiliary socket has a plurality of contacts received within the corresponding passageways of the auxiliary socket for conductively connected to the corresponding contacts of the upper connector.

17. A memory card connector assembly for use with at least a memory card including:

two mutually compactly stacked upper and lower connectors each includes a generally H-shaped housing comprising a main body through which a plurality of contacts extend;

two parallel side guide arms positioned at two ends of each main body to form a first recess in the front for receiving an alignment comb and/or an auxiliary and a second recess in the rear for receiving a memory card; and at least one alignment means received within one of the first recesses of housings for horizontal or vertical alignment of the contacts of the upper connector;

wherein said first recess formed among two front portions of the side guide arms and the main body for optional reception of an alignment comb and/or an auxiliary socket wherein a horizontal groove horizontally extends along an inner surface of the front portion of each side guide arms in a front-to-end direction so that said alignment comb can be loaded thereto in the front-to-end direction for fixedly interferential engagement therein, and a vertical groove vertically extends along an inner surface proximate an end of the front portion of each side guide arm in a direction perpendicular to a PC board, on which the lower connector is mounted, so that said auxiliary socket can be loaded thereto vertically for securely interferential engagement therein.

18. The memory card connector assembly as described in claim 17, wherein said alignment means is the alignment comb horizontally received within the first recess of the upper connector for horizontal alignment of the contacts of the upper connector.

19. The memory card connector assembly as described in claim 17, wherein said alignment means is the auxiliary socket vertically received within the first recess of the lower connector for vertical alignment of the contacts of the upper connector.

20. A memory card connector for use with a memory card including:

a generally H-shaped housing having a main body and a pair of parallel side guide arms oppositely positioned at two ends of the main body;

a plurality of contacts extending through the main body in a front-to-back direction;

a first recess formed among two front portions of the side guide arms and the main body for reception of an alignment comb and/or an auxiliary socket;

a second recess formed among two rear portions of the side guides arms and the main body for reception of the memory card;

ejection mechanism comprising an ejection bar positioned beside one of the said guide arm, a lever and a sliding plate positioned on the top of the housing and proximate the main body wherein the lever is swingably connected to the ejection bar and the sliding plate; and a reinforcement plate is adapted to be loaded to a bottom surface or a top surface of each housing in both upward and downward directions so that when two housings are stacked together, the space formed between two corresponding reinforcement plates is adapted to receive a thicker memory card therein.

* * * * *